(12) United States Patent
Santhakumar et al.

(10) Patent No.: US 12,703,036 B2
(45) Date of Patent: Aug. 11, 2026

(54) SELF CORRECTING OVEN TECHNOLOGY

(71) Applicant: JABIL INC., St. Petersburg, FL (US)

(72) Inventors: Charles Santhakumar, St. Petersburg, FL (US); Harpuneet Singh, St. Petersburg, FL (US); Anwar A. Mohammed, St. Petersburg, FL (US); Michael Torregrossa, St. Petersburg, FL (US)

(73) Assignee: Jabil, Inc., St. Petersburg, FL (US)

( * ) Notice: Subject to any disclaimer, the term of this patent is extended or adjusted under 35 U.S.C. 154(b) by 0 days.

(21) Appl. No.: 18/717,046

(22) PCT Filed: Dec. 7, 2022

(86) PCT No.: PCT/US2022/081073
§ 371 (c)(1),
(2) Date: Jun. 6, 2024

(87) PCT Pub. No.: WO2023/107992
PCT Pub. Date: Jun. 15, 2023

(65) Prior Publication Data

US 2025/0033131 A1 Jan. 30, 2025

Related U.S. Application Data

(60) Provisional application No. 63/265,060, filed on Dec. 7, 2021.

(51) Int. Cl.
*B23K 3/00* (2006.01)
*B23K 3/04* (2006.01)
(Continued)

(52) U.S. Cl.
CPC .............. *B23K 3/04* (2013.01); *B23K 3/0638* (2013.01); *B23K 3/08* (2013.01); *F27B 9/24* (2013.01);
(Continued)

(58) Field of Classification Search
CPC .......... B23K 3/04; B23K 3/0638; B23K 3/08; B23K 2101/36–42; B23K 1/008;
(Continued)

(56) References Cited

U.S. PATENT DOCUMENTS 4,809,308 A 2/1989 Adams et al.
5,564,183 A * 10/1996 Satou .................. H05K 13/083 29/714

(Continued)

FOREIGN PATENT DOCUMENTS

CN 101385409 A * 3/2009 ......... H05K 13/0812
CN 104400167 A * 3/2015 ............. B23K 1/002

(Continued)

*Primary Examiner* — Kiley S Stoner
(74) *Attorney, Agent, or Firm* — Shumaker, Loop & Kendrick, LLP; James D. Miller

(57) ABSTRACT

A reflow soldering oven for soldering and/or bonding component leads both electrically and mechanically to pads on a PCB in an SMT manufacturing system. The soldering oven includes at least one thermal infrared camera that generates thermal images of the PCB to provide thermal imaging processing to monitor and correct temperature deviations in real time. The oven generates a heat map using the thermal images and compares the heat map to a thermal gradient to provide real time profiling and to initiate changes like temperature control or the oven belt-speed monitoring to offer self-correcting capabilities.

16 Claims, 11 Drawing Sheets

(51) Int. Cl.

| | |
|---|---|
| ***B23K 3/06*** | (2006.01) |
| ***B23K 3/08*** | (2006.01) |
| ***F27B 9/24*** | (2006.01) |
| ***F27B 9/40*** | (2006.01) |
| ***G01N 21/956*** | (2006.01) |
| ***G01N 23/18*** | (2018.01) |
| ***H05K 3/12*** | (2006.01) |
| ***H05K 3/303*** | (2026.01) |
| ***H05K 13/04*** | (2006.01) |
| *B23K 101/42* | (2006.01) |
| *F27D 19/00* | (2006.01) |

(52) U.S. Cl.
CPC ............. *F27B 9/40* (2013.01); *G01N 21/956* (2013.01); *G01N 23/18* (2013.01); *H05K 3/1216* (2013.01); *H05K 3/303* (2013.01); *H05K 13/0404* (2013.01); *B23K 2101/42* (2018.08); *F27D 2019/0003* (2013.01); *F27D 2019/0059* (2013.01); *G01N 2021/95638* (2013.01)

(58) Field of Classification Search
CPC ............ B23K 1/0016; F27B 9/24; F27B 9/40; G01N 21/956; G01N 23/18; G01N 2021/95638; H05K 3/1216; H05K 3/303; H05K 13/0404; H05K 3/3485; H05K 3/3494; H05K 2203/163; F27D 2019/0003; F27D 2019/0059
USPC ......... 228/102–105, 8–12, 179.1–180.22, 43
See application file for complete search history.

(56) References Cited

U.S. PATENT DOCUMENTS

| | | | | |
|---|---|---|---|---|
| 5,971,249 | A * | 10/1999 | Berkin | F27B 9/243 228/103 |
| 6,352,192 | B1 * | 3/2002 | Lee | B23K 1/008 228/180.1 |
| 6,799,712 | B1 * | 10/2004 | Austen | B23K 1/008 228/103 |
| 2002/0146657 | A1 * | 10/2002 | Anderson | B23K 1/008 432/121 |
| 2006/0006210 | A1 * | 1/2006 | Nonomura | G05D 23/1951 228/101 |
| 2006/0082034 | A1 * | 4/2006 | Rogers | F27D 21/0014 266/87 |
| 2016/0057855 | A1 | 2/2016 | Riel | |
| 2016/0107253 | A1 * | 4/2016 | Kuhn | B23K 3/06 228/176 |
| 2018/0095109 | A1 | 4/2018 | Suto et al. | |
| 2020/0170155 | A1 | 5/2020 | Zheng et al. | |
| 2021/0215541 | A1 * | 7/2021 | Coliukos | G01R 31/309 |
| 2021/0315107 | A1 | 10/2021 | Vasudevan et al. | |
| 2022/0181177 | A1 * | 6/2022 | Becker | H01L 22/12 |
| 2023/0180395 | A1 * | 6/2023 | Becker | B23K 1/0016 228/180.21 |
| 2024/0248463 | A1 * | 7/2024 | Mohammed | G01N 33/0095 |
| 2024/0359245 | A1 * | 10/2024 | Colijn | B23K 3/08 |
| 2025/0033131 | A1 * | 1/2025 | Santhakumar | B23K 3/08 |
| 2025/0041958 | A1 * | 2/2025 | Santhakumar | B23K 1/085 |

FOREIGN PATENT DOCUMENTS

| | | | | | |
|---|---|---|---|---|---|
| CN | 104777166 | B | * | 9/2017 | G01N 21/956 |
| CN | 104837302 | B | * | 12/2017 | G01N 23/083 |
| CN | 107717168 | A | * | 2/2018 | B23K 3/08 |
| CN | 107889373 | A | * | 4/2018 | H05K 3/34 |
| CN | 110164784 | A | * | 8/2019 | H01L 24/11 |
| CN | 112548258 | A | * | 3/2021 | B23K 3/063 |
| EP | 0862962 | A2 | * | 9/1998 | F27B 9/40 |
| EP | 3242756 | B1 | * | 4/2021 | H05B 3/0009 |
| JP | H10107423 | A | * | 4/1998 | |
| JP | H10209629 | A | * | 8/1998 | |
| JP | 2007287779 | A | * | 11/2007 | H05K 13/0812 |
| JP | 2015153914 | A | * | 8/2015 | H05K 3/341 |
| JP | 2018056448 | A | * | 4/2018 | H05K 3/34 |
| KR | 102004336 | B1 | * | 7/2019 | H05K 3/3494 |
| KR | 20200006468 | A | * | 1/2020 | H01L 21/67242 |
| KR | 20200006469 | A | * | 1/2020 | H01L 21/67242 |
| TW | 202120235 | A | * | 6/2021 | B23K 1/0056 |
| WO | WO-2021228540 | A1 | * | 11/2021 | B23K 1/008 |
| WO | WO-2022120069 | A1 | * | 6/2022 | B23K 1/0016 |
| WO | WO-2022241427 | A1 | * | 11/2022 | H05K 13/083 |

* cited by examiner

SELF CORRECTING OVEN TECHNOLOGY

BACKGROUND

Field

This disclosure relates generally to a surface mount technology (SMT) manufacturing system for fabricating printed circuit board assemblies (PCBAs) and, more particularly, to an SMT manufacturing system for fabricating PCBAs that includes a reflow soldering oven having thermal imaging capabilities to self-correct oven profiles, conveyor speed, heated zones and fan speed in real time.

Discussion

SMT refers to a technique for fabricating electronic circuits where the components of the circuit are electrically mounted or placed directly on the surface of a PCB to produce a PCBA. The PCB is generally a flat dielectric board having a surface on which is formed tin-lead, silver or gold plated copper pads that do not have holes, known as solder pads, in a predetermined configuration. A solder paste, which is a sticky mixture of solder flux and solder particles or flakes, is deposited on the solder pads by using a stainless steel or nickel stencil and a screen printing process, but can also be applied by a jet-printing mechanism, such as an inkjet printer, where it is critical that the solder paste be accurately oriented to the solder pad to prevent short circuits and the like.

The PCB is then placed on a conveyor belt to be sent to a pick-and-place machine. The components to be mounted on the PCB are usually delivered to the pick-and-place machine on either a paper/plastic tape wound on a reel or a plastic tube, where large integrated circuits can be delivered to the pick-and-place machine on static-free trays. The pick-and-place machine removes the components from the tape, tube or tray and properly places them on the solder pads on the PCB in a predetermined manner, where the components are held in place by the tackiness of the solder paste. The PCB is then sent to a reflow soldering oven that includes a pre-heat zone, where the temperature of the PCB is gradually and uniformly raised. The PCB then enters a high temperature zone where the temperature is high enough to melt the solder particles in the solder paste, such as 260° C., which bonds the component leads to the solder pads on the PCB. The surface tension of the molten solder helps keep the components in place, and if the solder pad geometries are correctly designed, the surface tension automatically aligns the components on their pads. Known reflow soldering ovens employ thermocouples to measure heat, which are limited in their ability to provide heat measurements across a wide area.

It is known that most of the solder joint defects that occur in a PCBA are caused by improper solder paste printing. Therefore, SMT processes often employ a solder paste inspection (SPI) system to inspect the solder paste deposits on the PCB in order to identify the volume of the solder paste and the x, y and z orientation of the solder paste relative to the solder pads, i.e., the volumetric center of the solder paste is where it should be located, to reduce PCB defects. As the pitch of the components becomes more fine, i.e., the number of components on the same area of the PCB increases and the leads of the components become closer together, the exact position of the solder paste becomes more critical to prevent short circuits. Such SPI systems typically include an arrangement of cameras and other sensing devices to obtain a visual image of the solder paste on the PCB to provide the inspection.

However, known SPI systems used in SMT processes are limited in their capabilities. For example, known SPI systems are generally not able to identify the pitch of the components, i.e., the spacing between the components, where a higher pitch of the components may require a slower inspection speed. Another drawback with the known SPI systems is that they do not provide key printing variables such as temperature and humidity, which can change during the SMT process and can be used to determine the viscosity of the solder paste, where the viscosity identifies the rheology of the solder paste, which determines how well the solder paste will go through the stencil and stay on the solder pad. Also, the known SPI systems are typically not able to identify the type of solder flux in the solder paste to verify whether the correct solder flux is being used, or identify the type of solder or the size of the solder flakes being used. Currently, solder flux is color coded to identify it, but the known SPI systems cannot identify that color. All of the viscosity of the solder paste, the type of solder flux, the type of solder and the size of the solder flakes can be used to determine if the proper stencil or screen is being used.

Automated optical inspection (AOI) is an automated non-contact visual inspection process of circuit devices, such as PCBAs fabricated by SMT processes, where a camera autonomously scans the PCBA to monitor for catastrophic failure, such as missing parts, and quality defects, such as solder flow issues. However, known AOI processes for SMT are also limited in their capabilities. For example, known AOI processes do not determine the presence or measure the volume of inter-metallic compounds (IMCs), i.e., undesirable materials that are generated by the type of solder and the solder flow process, which could affect the electrical connection of the component leads to the solder pads and cause a reliability issues. Further, known AOI systems do not determine whether voids exist between the flowed solder and the solder pads, which also could affect thermal and electrical bond integrity. Specifically, if the voids between the flowed solder and the solder pads are numerous enough or large enough, power dissipation, i.e., heat removal, may be effected, especially for high pitch components. Also, known AOI systems do not determine whether the flowed solder is planar relative to the solder pads, i.e., the slope of the soldered bond line thickness (BLT), which limits its ability to be wire-bonded.

Variations of SMT manufacturing processes often result in undesirable post-reflow component conditions during PCB reflow that fail SMT workmanship quality standards, commonly referred to as SMT manufacturing defects. These SMT defects have a significant impact on product quality and manufacturing costs due to the waste associated with scrap, rework, downtime and other non-value add activities.

SUMMARY

This disclosure discloses and describes a reflow soldering oven for soldering and/or bonding component leads both electrically and mechanically to pads on a PCB in an SMT manufacturing system. The soldering oven includes at least one thermal infrared camera that generates thermal images of the PCB to provide thermal imaging processing to monitor and correct temperature deviations in real time. The oven generates a heat map using the thermal images and compares the heat map to a thermal gradient to provide real time profiling and to initiate changes like temperature control or the oven belt-speed monitoring to offer self-correcting capabilities.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to an SMT manufacturing system for fabricating PCBAs that includes a reflow soldering oven having thermal imaging capabilities to self-correct oven profiles, conveyor speed, heated zones and fan speed in real time is merely exemplary in nature, and is in no way intended to limit the disclosure or its applications or uses.

Figure 1:
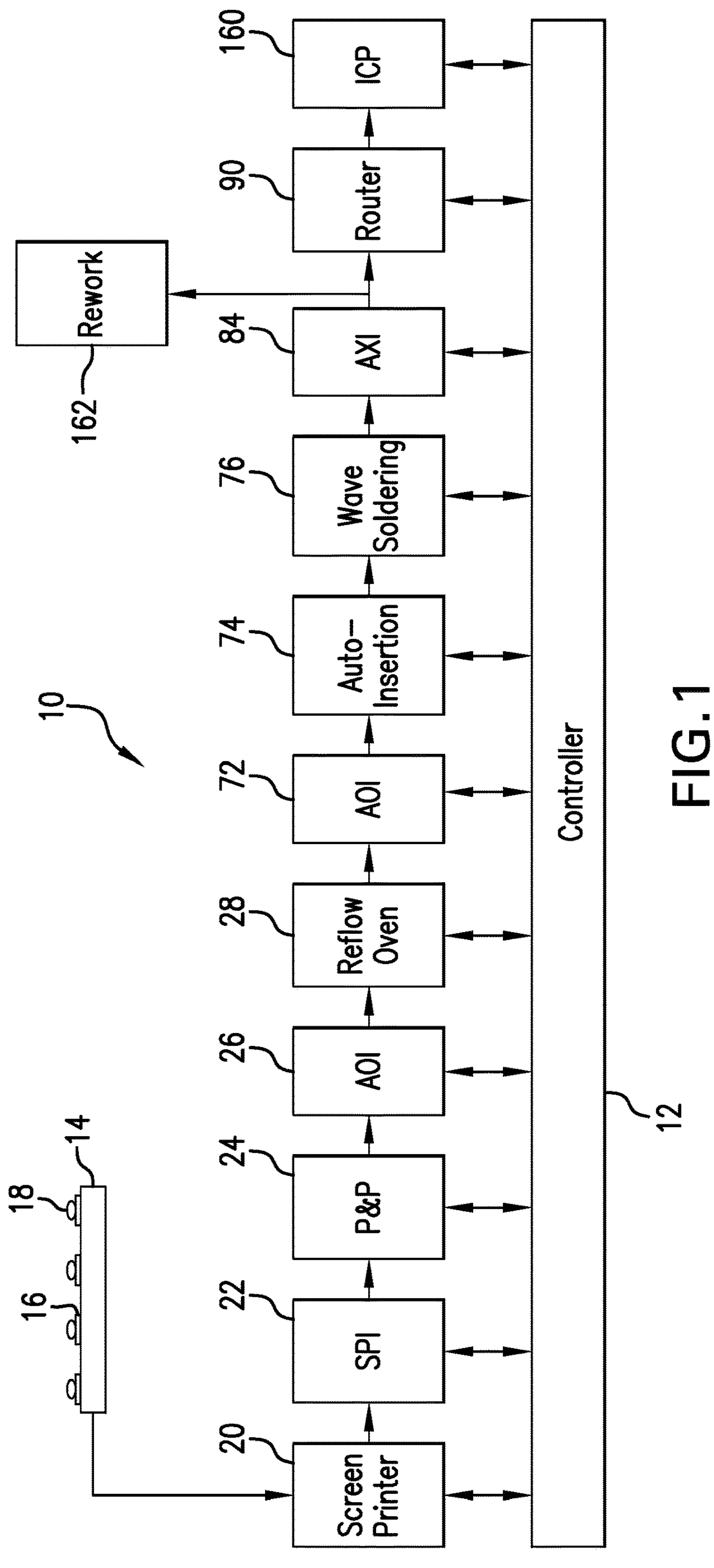
FIG. 1 is a simplified block diagram of an SMT manufacturing system for fabricating PCBAs.

FIG. 1 is a simplified block diagram of an SMT manufacturing system 10 for fabricating PCBAs that includes a system controller 12. The system 10 is intended to represent any suitable circuit fabrication system consistent with the discussion herein. The controller 12 can employ a Markov decision process (MDP) model that operates as a lossless abstraction algorithm that compares the behavior abstraction of an SMT process model with finite event log behavior. The controller 12 provides learned phenomenon for comparing finite event log behavior with infinite SMT process model behavior to determine (predict) potential yield loss outcome. The controller 12 can include a component rejection prediction model that uses a multi-regression analysis ensemble model solution. An artificial intelligence/machine learning (AI/ML) model operating in the controller 12 accepts basic material and process data from a screen printer, provides critical measurement data from numerous inspection systems, correlates and characterizes optimal process tolerance window, provides prognostic and predictive conditions for PCB quality issues, and provides closed loop optimization commands back to process steps to maintain an in-control processes.

Raw material data and environmental conditions, such as PCB surface finish, PCB thickness, etc., are provided to the controller 12 for a panel 14 including an array of PCBs 16 having conductive solder pads 18 on a top surface thereof being processed. The panel 14 is provided to a screen printer 20 and is subjected to a printing process for depositing a solder paste, i.e., a mixture of solder flux and solder particles or flakes, on the solder pads 18 using, for example, a stainless steel or nickel stencil or screen by known processes. The screen printer 20 provides process data and variables, such as solder paste type, cleaning cycle stroke, screen printer parameters, etc., to the controller 12 and the controller 12 provides feedback, such as pressure adjustments, squeegee changes, stencil cleaning, etc. determined from upstream processes and inspections for screen printing self-correction to the screen printer 20.

The panel 14 is then sent to an SPI sub-system 22 to inspect the solder paste deposited on the PCBs 16 and identify any defects or other issues that would reduce PCB reliability. The SPI sub-system 24 includes an array of cameras (not shown) that obtain visual images of the solder joints on the PCBs 16, and other sensing devices, such as a temperature sensor and a humidity sensor. Images from the cameras and measurement data, such as solder paste offset measurements, are provided to the controller 12 that processes the signals to provide inspection information. This information can include identifying the pitch or resolution of the components that may require slower inspection speeds, and using temperature and humidity measurements to determine the viscosity of the solder paste to obtain its rheology. The cameras have a resolution and image quality that allows the cameras to provide images that allow the controller 12 to identify the solder flux in the solder paste by its color, identify the type of solder in the solder paste by its color, and identify the size of the solder flakes in the solder paste. All of this information can be used to determine if the proper solder is being used and the proper screen is being used for the PCBs 16 currently being fabricated. The controller 12 can provide feedback from upstream processes and inspections to the SPI sub-system 22. The feedback may require that the inspection process be slowed down, and thus the SPI sub-system 22 can alter its inspection speed on the fly as needed. The SPI sub-system 22 will enable SMT manufacturers to produce PCBAs with enhanced reliability and yields and also minimize any errors caused by using the wrong solder or flux, prevent any printing errors caused by viscosity, temperature or humidity and better detect any printing errors on fine pitch components.

If the panel 14 passes the SPI process and is not scrapped, the panel 14 is delivered to a pick-and-place machine 24 for placing circuit components on the solder pastes. Particularly, the components are delivered on a tape and are picked off of the tape by the machine 24 and placed on the proper solder paste in a predetermined manner, where the components are held in place by the tackiness of the solder paste. The machine 24 provides process data and variables, such as GRN, package, machine, etc., to the controller 12 and the controller 12 can provide feedback from upstream processes and inspections, such as change nozzle or feeder, adjust part definition, change placement position, optimize placement offset for better placement, perform maintenance, etc., to the machine 24 for self-correction purposes. Thus, if the controller 12 determines that the location of all of the solder pastes are off-set by a certain distance, the machine 24 can receive this information and adjust the location that it drops the components accordingly.

The panel 14 now with the components on the PCBs 16 is then sent to an AOI sub-system 26 including one or more sophisticated cameras or other vision devices. Images from the cameras and other information, such as full component condition, component off-set measurements, etc., are sent to the controller 12. The resolution and quality of the cameras is such that the images can identify or detect the presence and volume of inter-metallic compounds in the flowed solder between the component and the solder pads, which can provide an indication of the quality of the solder bond. The controller 12 can detect the presence and size of voids between the flowed solder and the solder pads from the images to determine the thermal capability, i.e., heat removal, of the PCBs 16. Also, the controller 12 can detect the slope of the soldered bond line thickness (BLT) from the images, which allows for better wire bonding. The controller 12 can provide feedback, such as adjust pre-flow program parameter settings to detect specific condition alerted at post-AOI, from upstream processes and inspections to the AOI sub-system 26 for self-correction purposes.

The panel 14 is then sent to a self-correcting reflow soldering oven 28, where the temperature in the oven 28 is high enough to melt the solder particles in the solder paste, which bonds the component leads both electrically and mechanically to the pads 18 on the PCBs 16. The surface tension of the molten solder helps keep the components in place, and if the solder pad geometries are correctly designed, surface tension automatically aligns the components on their solder pads. The oven 28 provides process data and variables to the controller 12 and the controller 12 can provide feedback from upstream processes and inspections to the oven 28 for self-correction purposes.

Figure 2:
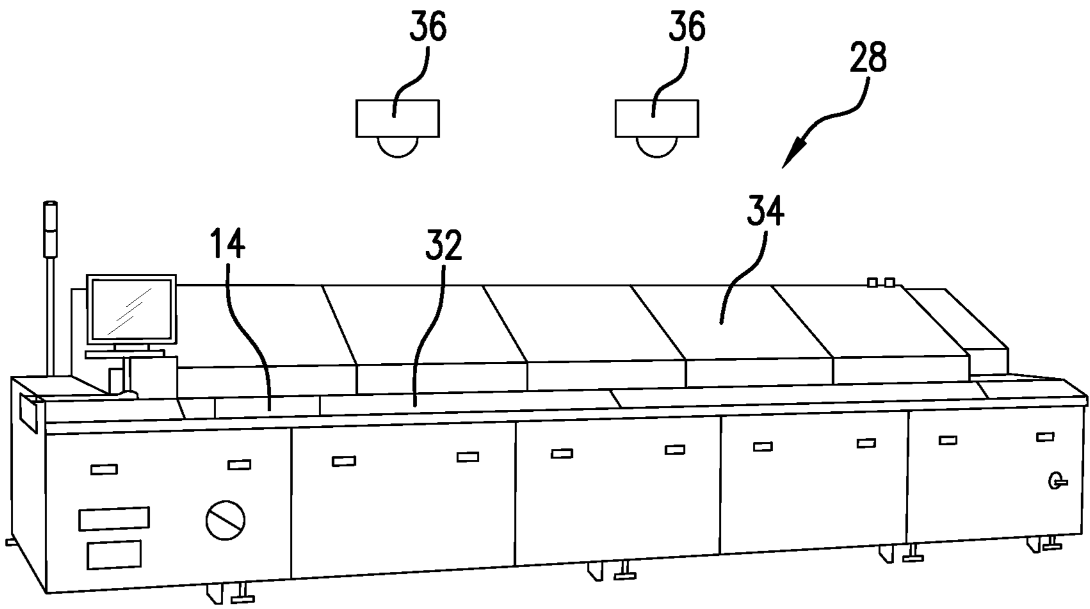
FIG. 2 is an illustration of a self-correcting reflow soldering oven separated from the system shown in FIG. 1.

FIG. 2 is an illustration of the reflow soldering oven 28 separated from the STM system 10 showing the panel 14 moving along a conveyor 32 through heated zones 34. The oven 28 includes a number of IR or thermal imaging cameras 36 strategically positioned within the oven 28 that provide digital thermal imaging capabilities across a wide area and monitor and correct temperature deviations in real time to accurately transfer heat and increase capabilities to ensure all of the PCBs 16 achieve the desired temperature profile. In one non-limiting embodiment, there are four cameras located at corners of the oven 28 that are able to identify specific hotspots in the oven 28. The cameras 36 generate a thermal heat map across the panel 14 that identifies temperature variations and gradients. The thermal imaging provides self-correcting oven profiles, conveyor speeds, heated zones and fan speeds. For example, if a measured temperature is out of a predetermined range, the heat zones can be changed and/or conveyor speeds can be automatically adjusted to correct the temperature deviation. This eliminates defects and latent failures, and allows predictive and self-correcting processing in a closed loop system.

Figure 3:
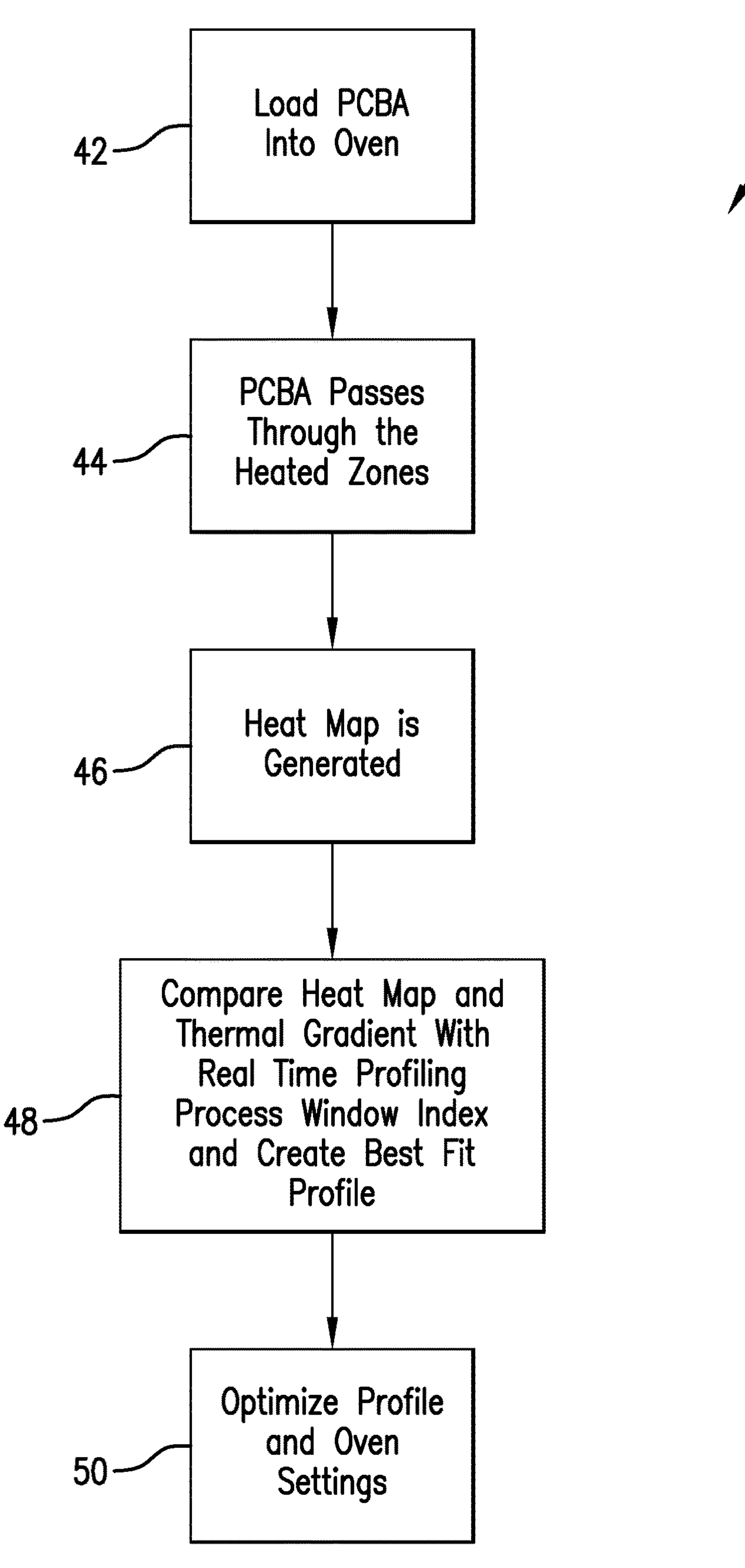
FIG. 3 is a flow chart diagram showing a process for creating pass/fail criteria of PCBs be subjected to the reflow soldering oven.

FIG. 3 is a flow chart diagram 40 showing a process for creating pass/fail criteria of the panel 14 as it is subjected to the reflow operation in the oven 28. At box 42, the panel 14 is loaded into the reflow oven 28 and at box 44, the panel 14 passes through the heated zones 34 in the oven 28. At box 46, a heat map is generated at the field-of-view (FOV) of the thermal imaging cameras 36. At box 48, the heat map is compared to a thermal gradient with a real time profiling process window index and a best fit profile is created. At box 50, the profile and oven settings are optimized.

Figure 4:
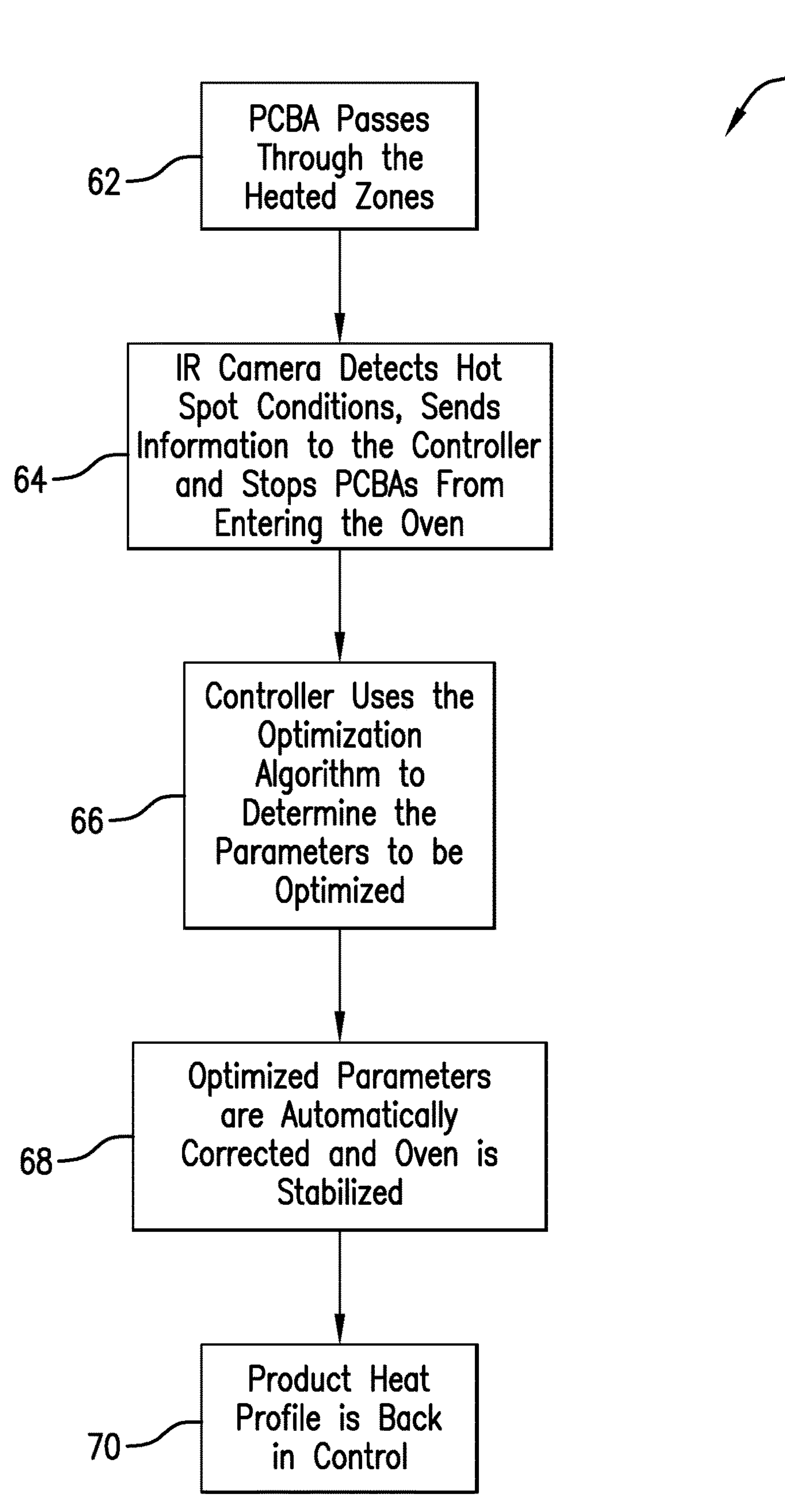
FIG. 4 is a flow chart diagram showing a process for closed loop logic flow of the reflow soldering oven.

FIG. 4 is a flow chart diagram 60 showing a process for closed loop logic flow for the self-correcting oven 28. At box 62, the panel 14 passes through the heated zones 34 in the oven 28. At box 64, the thermal cameras 36 detect out of control hot spot conditions, sends information to a controller 12 and stops the panel 14 from entering the oven 28. At box 66, the controller 12 uses an optimization algorithm to determine the parameters to be optimized. At box 68, the optimized parameters are automatically corrected and the oven 28 is stabilized. At box 70, the PCB heat profile is put back into control.

The panel 14 is then sent to another AOI sub-system 72 including one or more sophisticated cameras or other vision devices that operates in the same manner as the sub-system 26, and provides data, such as post reflow SMT quality condition, to and receives feedback, such as trigger post-reflow AOI inspection based on predicted post-reflow defects, from the AI/ML model in the controller 12 for self-correction purposes.

The panel 14 is then sent to an auto-insertion machine 74 that inserts additional components on the PCBs 16 that are not able to be placed by the pick-and-place machine 24, where the machine 74 provides data to and receives feedback from the controller 12 for self-correction purposes.

Figure 5:
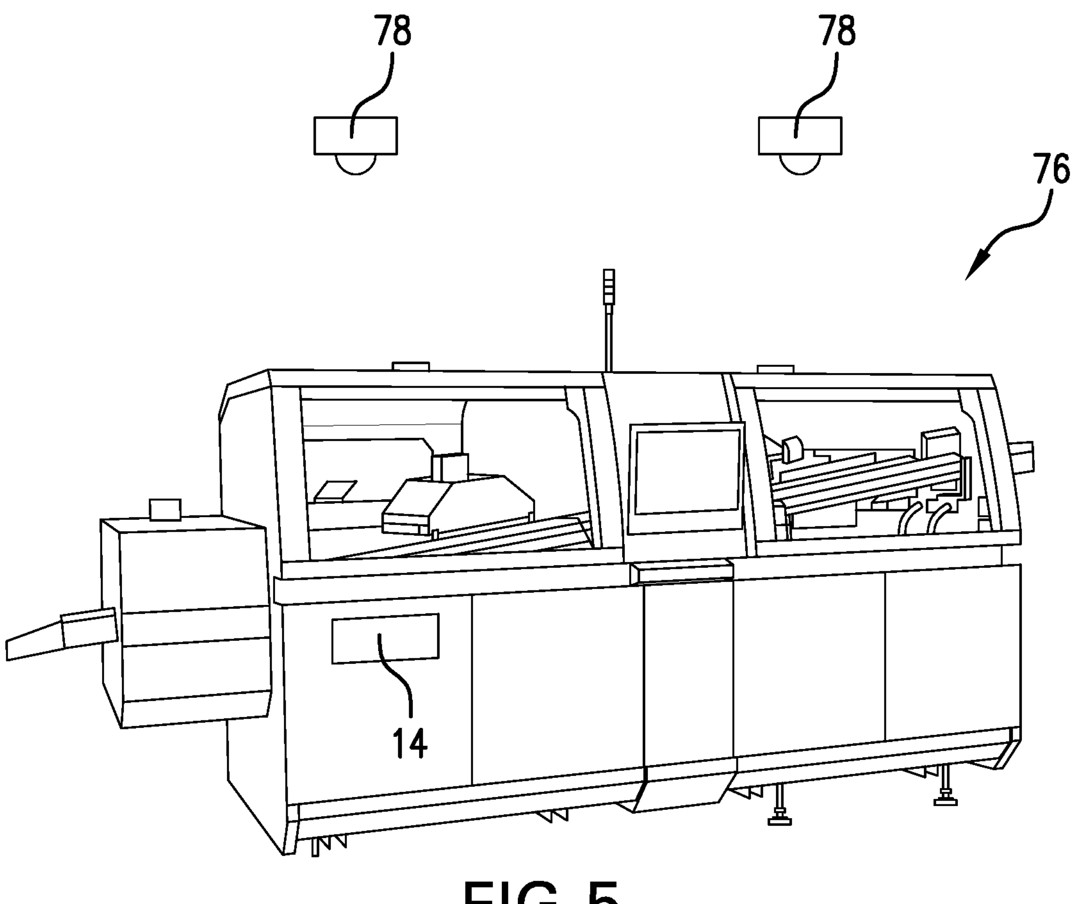
FIG. 5 is an illustration of a self-correcting wave soldering machine separated from the system shown in FIG. 1.

The panel 14 is then sent to a wave soldering machine 76 that provides a bulk soldering process that is mainly used in soldering of through hole components, where the machine 76 provides data to and receives feedback from the controller 12 for self-correction purposes. FIG. 5 is an illustration of the wave soldering machine 76 separated from the STM system 10 showing the panel 14 being subjected to the soldering process. The machine 76 includes IR or thermal imaging cameras 78 that provides thermal images to the controller 12 to provide thermal imaging processing to monitor, characterize and predict processing temperatures for self-correcting the wave soldering machine 76. The controller 12 generates a heat map of the panel 14 using the thermal images and compares the heat map to a thermal gradient to provide real time self-correction heating. The controller 12 further provides profiling capabilities by digitally connecting the heat map to heating and other mechanically controlled systems, such as flux dispensing, conveyor speed and parallelism of the wave soldering machine 76.

The panel 14 is then sent to an in-line X-ray inspection machine 84 that performs an X-ray inspection process to provide a high speed, solder coverage test for hidden joints, where the machine 84 provides data to and receives feedback from the controller 12 for self-correction purposes. Ball grid array (BGA), quad flat no-lead package (QFN) and plated through hole (PTH) barrel fill items are generally inspected during the X-ray inspection process based on the Institute Printed Circuits (IPC) acceptance criteria.

Figure 6:
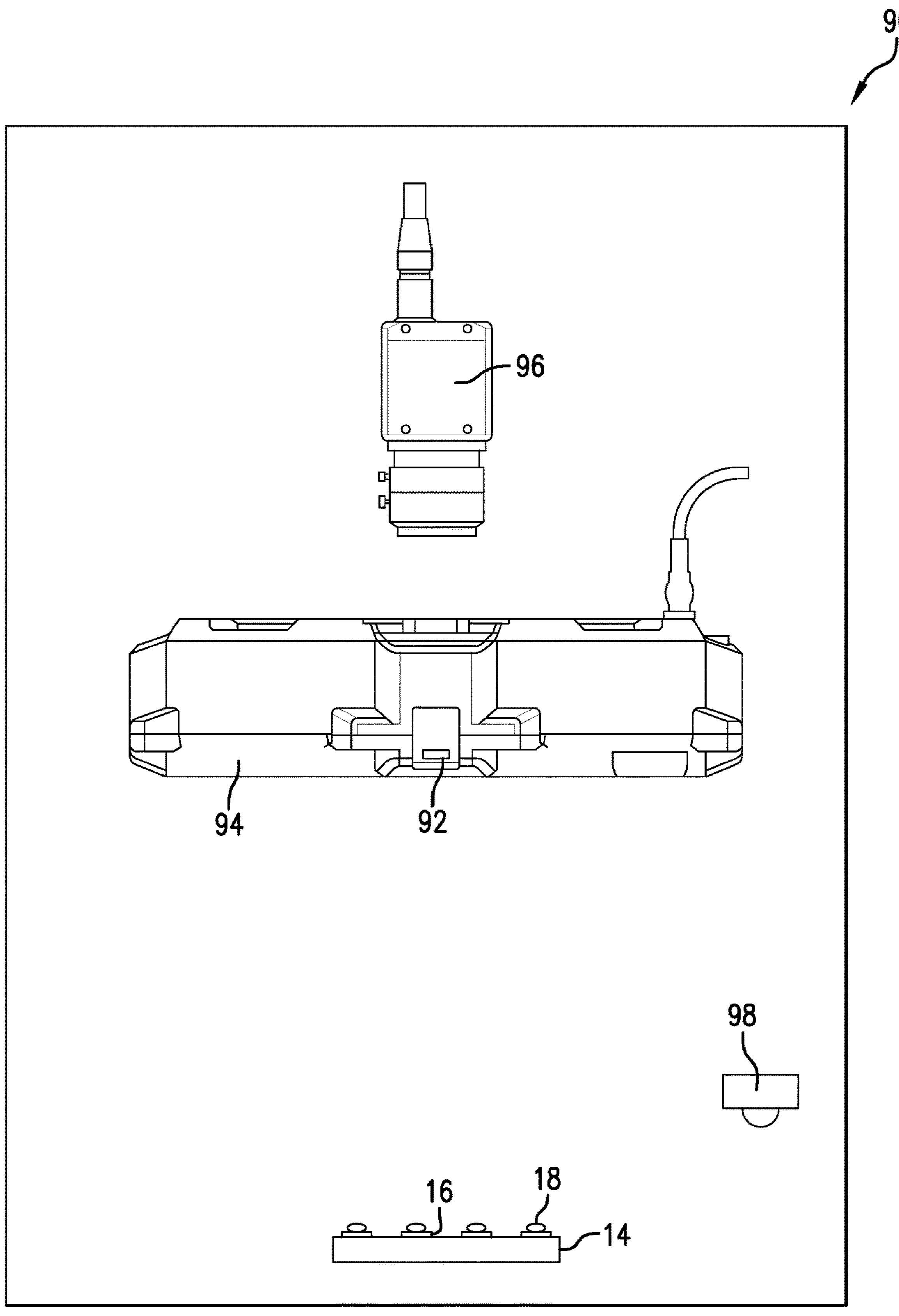
FIG. 6 is an illustration of a router separated from the system shown in FIG. 1.

If the panel 14 passes the X-ray inspection, then the PCBs 16 are separated from each other by a router 90 that cuts the panel 14 along predetermined cut lines on the panel 14 to provide the separate integrated circuits. FIG. 6 is an illustration of the router 90 separated from the STM system 10 showing the panel 14 positioned relative to a router bit 92. A multi-spectral lighting system 94 is also positioned relative to the panel 14 and the bit 92, and a camera 96 is axially aligned with the bit 92. The camera 96 generates images of the panel 14 as it is being cut to monitor and self-correct the router's deficiencies to accurately self-correct in real time and increase the capabilities to ensure the panel 14 achieves the desired de-panelization results without debris or defects, which allows predictive and self-correcting processing in a closed loop system. Another camera 98 is positioned at an output of the router 90. By using the cameras 96 and 98 and employing smart router capabilities, self-correcting of router cuts and the reduction of debris can be achieved by optimizing spindle speed, conveyor speed, panel positioning, spindle height, bit offset, broken bit, worn out bit, gantry positioning (X, Y, Z), panel support height, vacuum pressure and vacuum speed real time. For example, if the camera 96 detects that the router bit 92 is deviating from its desired cut line, corrections to the router bit 92 can be made in real time to put it back on line.

Figure 7:
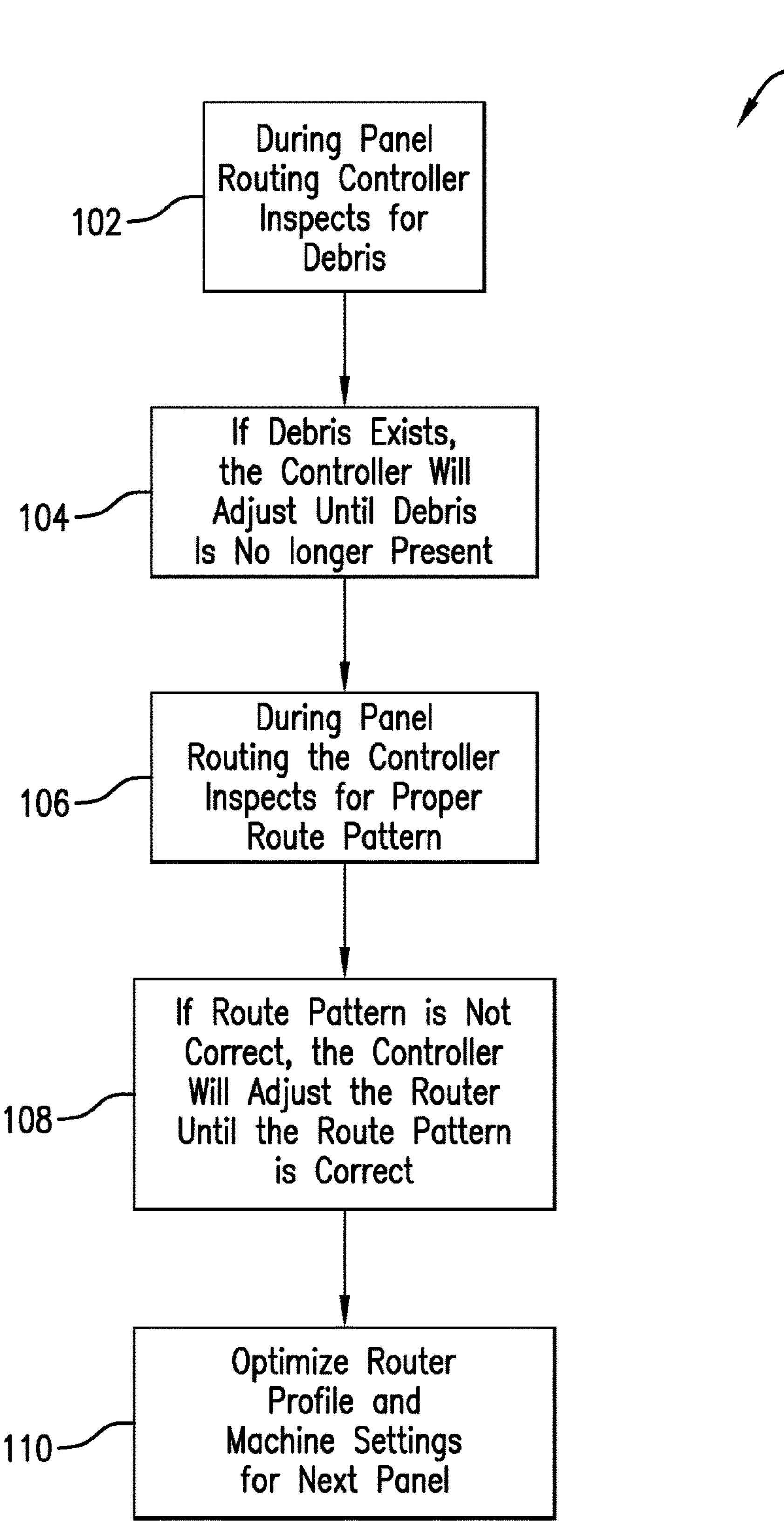
FIG. 7 is a flow chart diagram showing a process for identifying fail criteria of PCBs subjected to the router.

FIG. 7 is a flow chart diagram 100 showing a process for identifying fail criteria in the router 90 using images from the camera 96 in the controller 12. At box 102, the controller 12 inspects for debris during the route pattern of the panel 14 through the router 90, and at box 104, if debris does exist, the controller 12 adjusts the route pattern of the panel 14 until debris is no longer present. At box 106, the controller 12 inspects the route pattern of the panel 14, and if the route pattern of the panel 14 is incorrect, the route pattern of the panel 14 is corrected by the controller 12 at box 108. The profile and settings of the router 90 are optimized by the controller 12 for the next panel 14 at box 110.

Figure 8:
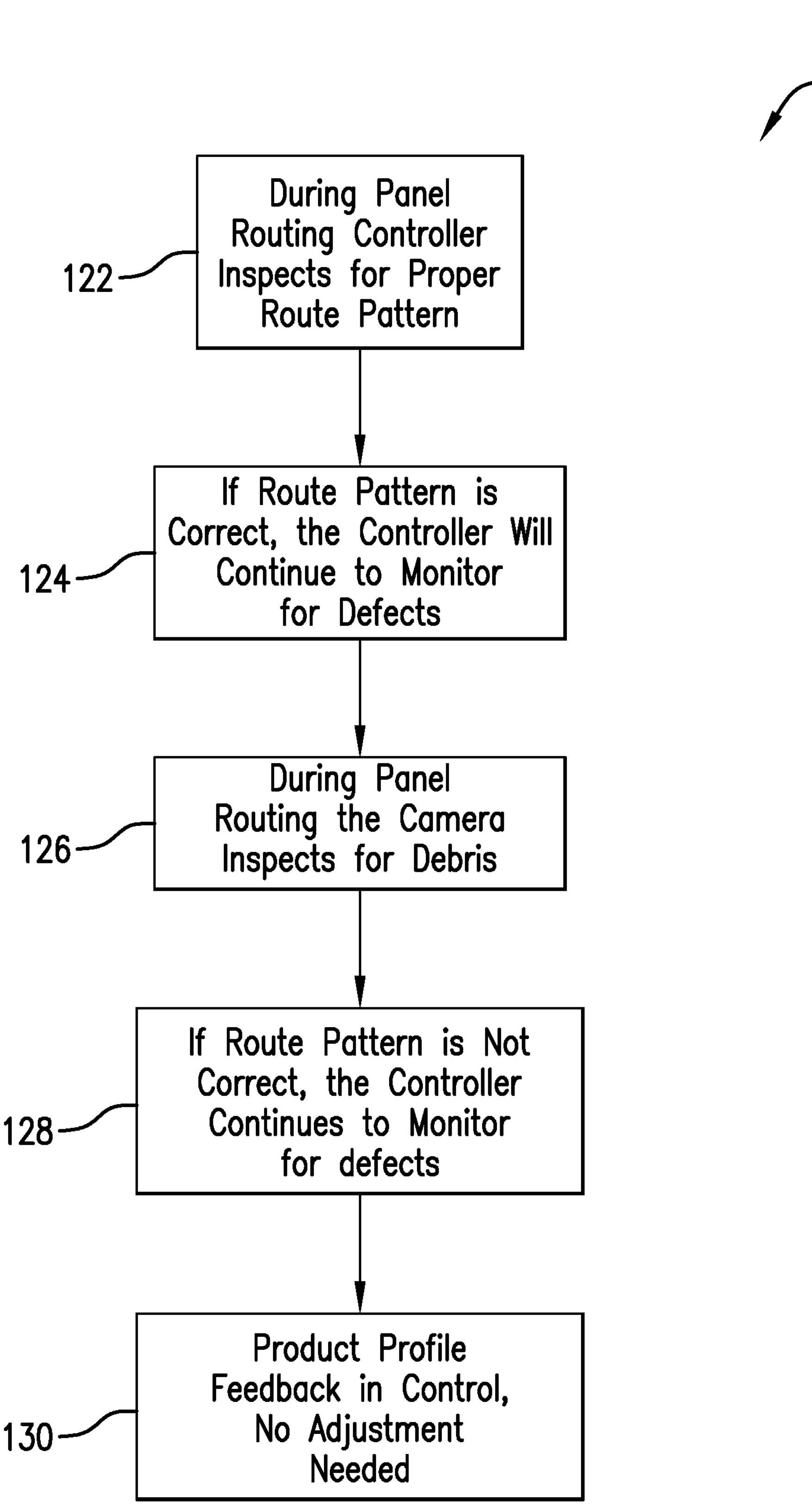
FIG. 8 is a flow chart diagram showing a process for identifying pass criteria of PCBs subjected to the router.

FIG. 8 is a flow chart diagram 120 showing a process for identifying pass criteria in the router 90 using images from the camera 96 in the controller 12. At box 122, the controller 12 inspects the route pattern of the panel 14, and at box 124, if the route pattern of the panel 14 is correct, the controller 12 continues to monitor for defects. At box 126, as the panel 14 is being routed through the router 90, the camera 96 inspects for debris. At box 128, if the route pattern of the panel 14 is not correct, the controller 12 continues to monitor for defects. The product profile feedback is provided at box 130.

Figure 9:
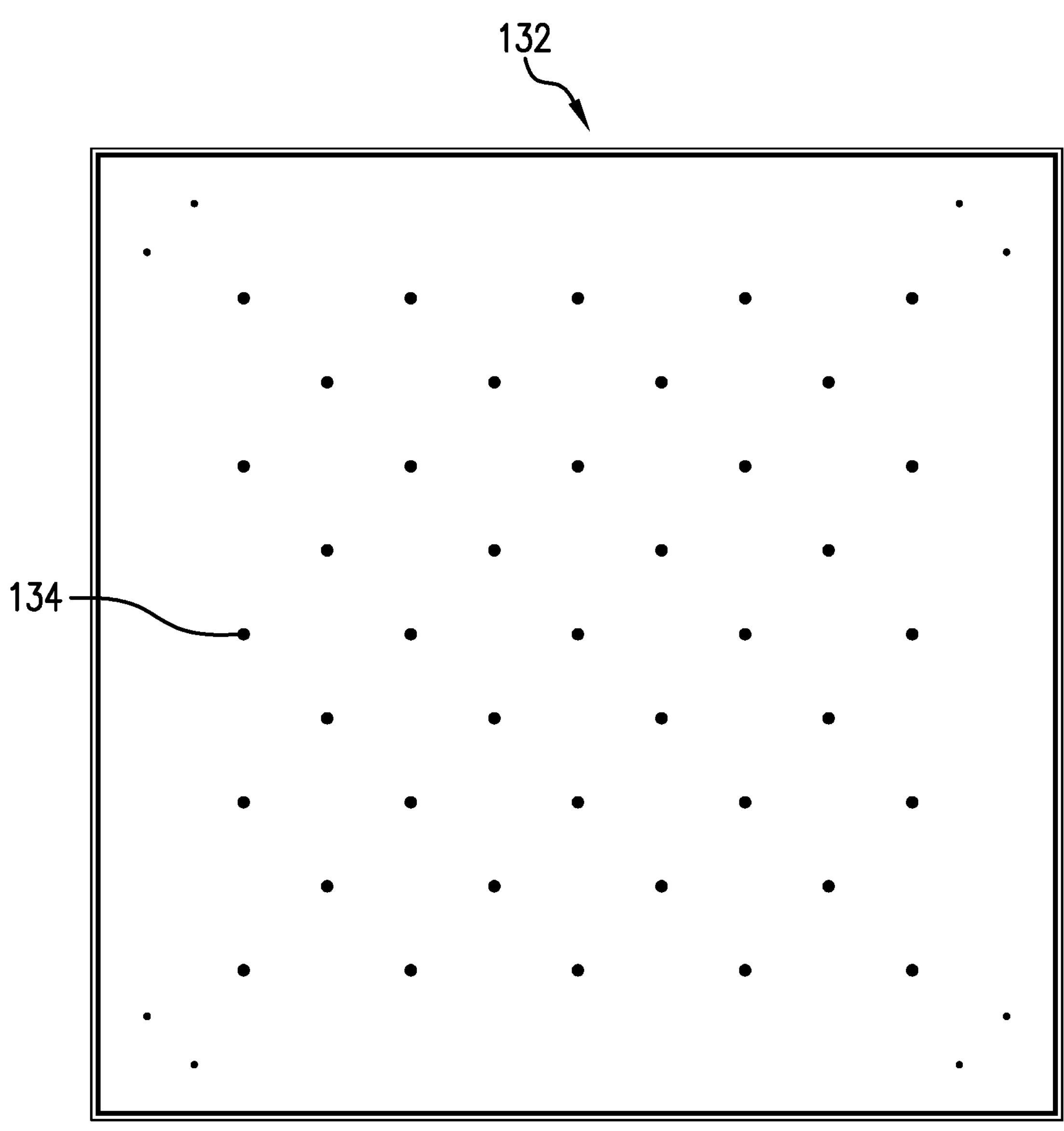
FIG. 9 is a top view of a test panel having drill hole identifications.

There is currently no process or technique for measuring the accuracy and repeatability, i.e., the gantry X-Y offset, of a router of the type described above that could reduce issues with over cut and undercut from mechanical issues or lack of preventative maintenance or ensure that a new router is properly calibrated. This disclosure proposes providing a panel having multiple drill points strategically identified on the panel based on a proper alignment of a panel gantry to the router bit 92. FIG. 9 is a top view of a panel 132 having a matrix of CAD based drill locations 134, here forty points, that identify where the panel 132 should be drilled by the router 90 if it is accurately configured. Therefore, by drilling a test panel with the router 90 and optically comparing it to the panel 132 the X-Y offset of the router 90 can be determined. Multiple test panels can be provided and selected from for a particular router.

Figure 10:
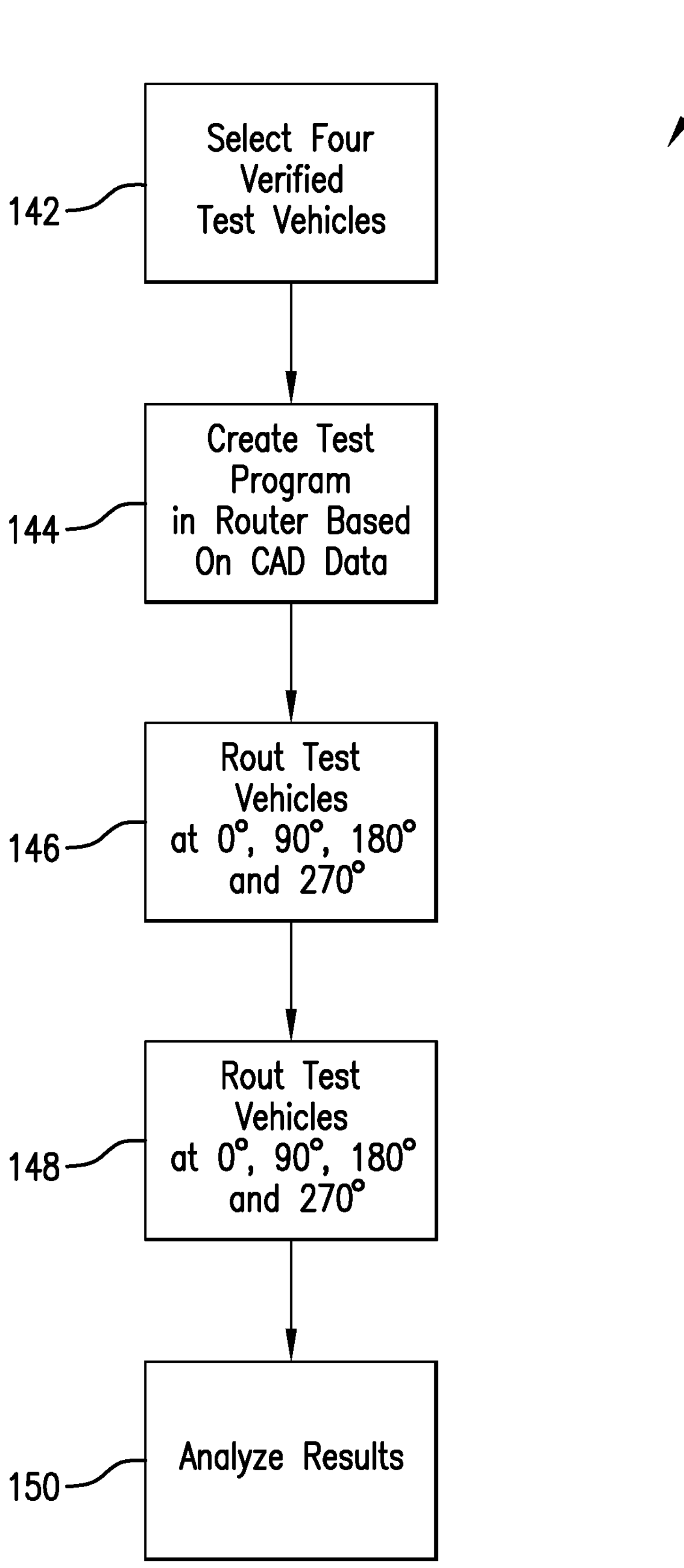
FIG. 10 is a flow chart diagram showing a process for using the test panel.

FIG. 10 is a flow chart diagram 140 showing a process for using the test panel 132. At box 142, four verified test panels are selected. At box 144, a test program is created in the router 90 based on CAD data. At box 146, the test panels are routed at 0°, 90°, 180° and 270°, and at box 148, the test panels are inspected at 0°, 90°, 180° and 270°. At box 150, the results are optically analyzed.

The individual PCBs 16 are then sent to an in-circuit testing machine 160 that provides electrical testing on the PCB 16, where the machine 160 provides data to and receives feedback from the controller 12 for self-correction purposes.

Figure 11:
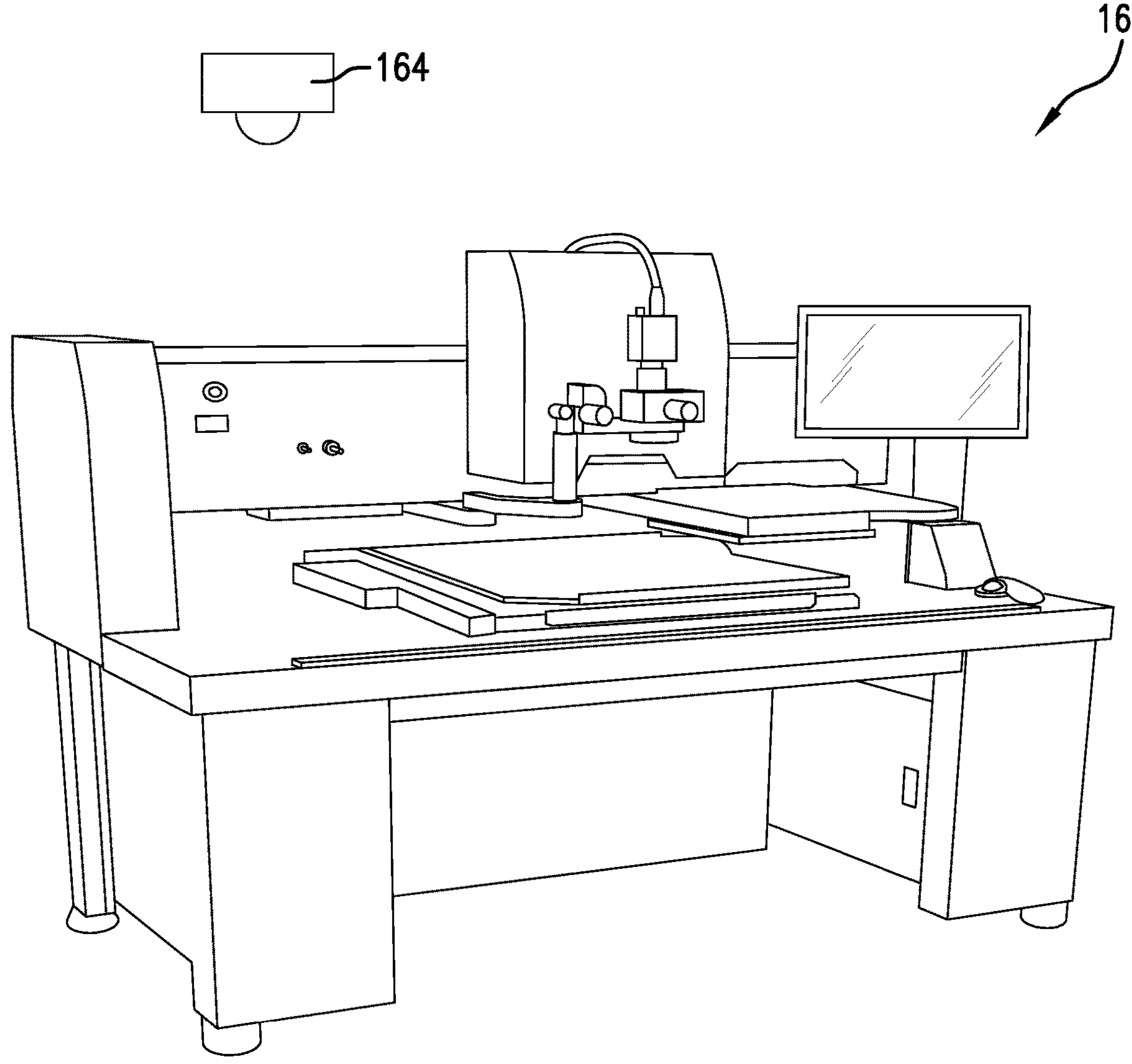
FIG. 11 is an illustration of a rework machine separated from the system shown in FIG. 1.

If the panel 14 does not pass the X-ray inspection by the machine 84, for example, there may be an electrical short, the panel 14 may be sent to a rework machine 162 to make corrections. The machine 162 can provide localized heating of the panel 14 to correct solder flows or global heating for the entire panel 14. FIG. 11 is an illustration of the rework machine 162 separated from the STM system 10 showing the panel 14 being subjected to the rework process. The machine 162 includes an IR or thermal imaging camera 164 that provides heat map images of the panel 14. The same process shown in FIG. 3 for the self-correcting oven 28 can be employed for the rework machine 162.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A surface mount technology (SMT) manufacturing system for fabricating printed circuit board assemblies (PCBAs), said system comprising:

a printer for depositing solder paste on conductive solder pads on a printed circuit board (PCB);

a pick-and-place machine for placing circuit components on the solder paste;

a reflow soldering oven for bonding component leads both electrically and mechanically to the pads on the PCB, said soldering oven including at least one thermal infrared camera that generates thermal images of the PCB; and a controller responsive to the thermal images and providing thermal imaging processing to monitor and correct temperature deviations in real time in the soldering oven, wherein the reflow soldering oven provides process data and variables to the controller and the controller provides feedback from upstream processes and inspections to the reflow soldering oven for self-correction purposes, and wherein the printer provides process data and variables to the controller and the controller provides feedback to the printer for self-correction purposes, and wherein the pick-and-place machine provides process data and variables to the controller and the controller provides feedback to the pick-and-place machine for self-correction purposes.

2. The system according to claim 1 wherein the controller generates a heat map using the thermal images and compares the heat map to a thermal gradient to provide real time profiling.

3. The system according to claim 2 wherein the controller self-corrects one or more of oven profiles, conveyor speed, heated zones and fan speed in real time.

4. The system according to claim 1 wherein the at least one thermal infrared camera is a plurality of thermal infrared cameras.

5. The system according to claim 1 further comprising a solder paste inspection (SPI) sub-system for inspecting the solder paste deposited on the solder pads to identify defects or other issues that would reduce PCB reliability.

6. The system according to claim 1 further comprising an automated optical inspection (AOI) sub-system for identifying or detecting the presence and volume of inter-metallic compounds in the solder between the components and the solder pads.

7. The system according to claim 1 further comprising an auto-insertion machine that inserts additional components on the PCB that are not able to be placed by the pick-and-place machine.

8. The system according to claim 1 further comprising an in-line X-ray inspection machine that performs an X-ray inspection process of the PCB to determine solder coverage.

9. The system according to claim 8 further comprising a rework machine that corrects solder flows if the PCB does not pass the X-ray inspection process.

10. The system according to claim 1 further comprising an in-circuit testing machine that provides electrical testing of the PCB.

11. The system according to claim 1 wherein the printer is a screen printer.

12. A surface mount technology (SMT) manufacturing system for fabricating printed circuit board assemblies (PCBAs), said system comprising:

a screen printer for depositing solder paste on conductive solder pads on a printed circuit board (PCB);

a pick-and-place machine for placing circuit components on the solder paste;

a reflow soldering oven for bonding component leads both electrically and mechanically to the pads on the PCB, said soldering oven including at least one thermal infrared camera that generates thermal images of the PCB;

a solder paste inspection (SPI) sub-system for inspecting the solder paste deposited on the solder pads to identify defects or other issues that would reduce PCB reliability;

an automated optical inspection (AOI) sub-system for identifying or detecting the presence and volume of inter-metallic compounds in the solder between the components and the solder pads;

an auto-insertion machine that inserts additional components on the PCB that are not able to be placed by the pick-and-place machine;

an in-line X-ray inspection machine that performs an X-ray inspection process of the PCB to determine solder coverage;

a rework machine that corrects solder flows if the PCB does not pass the X-ray inspection process;

an in-circuit testing machine that provides electrical testing of the PCB; and a controller responsive to signals from and providing signals to the pick-and-place machine, the reflow soldering oven, the SPI sub-system, the AOI sub-system, the auto-insertion machine, the in-line X-ray inspection machine, the rework machine and the in-circuit testing machine, and providing system self correcting features, wherein the reflow soldering oven provides process data and variables to the controller and the controller provides feedback from upstream processes and inspections to the reflow soldering oven for self-correction purposes, and wherein the printer provides process data and variables to the controller and the controller provides feedback to the printer for self-correction purposes, and wherein the pick-and-place machine provides process data and variables to the controller and the controller provides feedback to the pick-and-place machine for self-correction purposes.

13. The system according to claim 12 wherein the controller is responsive to the thermal images and provides thermal imaging processing to monitor and correct temperature deviations in real time in the soldering oven.

14. The system according to claim 13 wherein the controller generates a heat map using the thermal images and compares the heat map to a thermal gradient to provide real time profiling.

15. The system according to claim 14 wherein the controller self-corrects one or more of oven profiles, conveyor speed, heated zones and fan speed in real time.

16. The system according to claim 12 wherein the at least one thermal infrared camera is a plurality of thermal infrared cameras.

* * * * *